United States Patent
Punzalan et al.

(10) Patent No.: US 7,339,258 B2
(45) Date of Patent: Mar. 4, 2008

(54) DUAL ROW LEADFRAME AND FABRICATION METHOD

(75) Inventors: Jeffrey D. Punzalan, Singapore (SG); Jose Alvin Caparas, Singapore (SG); Jae Hun Ku, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 10 days.

(21) Appl. No.: 11/379,740

(22) Filed: Apr. 21, 2006

(65) Prior Publication Data

US 2006/0186515 A1    Aug. 24, 2006

Related U.S. Application Data

(62) Division of application No. 10/846,171, filed on May 13, 2004, now Pat. No. 7,060,536.

(51) Int. Cl.
*H01L 23/496* (2006.01)

(52) U.S. Cl. .................................................. 257/666

(58) Field of Classification Search ........ 257/666–674, 257/E33.066
See application file for complete search history.

(56) References Cited

U.S. PATENT DOCUMENTS

| | | | |
|---|---|---|---|
| 6,455,922 B1 | 9/2002 | Arguelles et al. | |
| 6,462,408 B1 | 10/2002 | Wehrly, Jr. | |
| 6,703,692 B1 | 3/2004 | Pruitt | |
| 6,710,431 B2 * | 3/2004 | Shibata | 257/669 |
| 6,841,854 B2 * | 1/2005 | Itou et al. | 257/666 |
| 2002/0041011 A1 * | 4/2002 | Shibata | 257/667 |
| 2004/0061204 A1 * | 4/2004 | Han et al. | 257/666 |
| 2004/0070055 A1 * | 4/2004 | Punzalan et al. | 257/666 |
| 2004/0070056 A1 * | 4/2004 | Matsuzawa et al. | 257/666 |
| 2004/0159918 A1 * | 8/2004 | Lee | 257/670 |
| 2004/0217450 A1 * | 11/2004 | Li et al. | 257/666 |
| 2006/0151858 A1 * | 7/2006 | Ahn et al. | 257/666 |

* cited by examiner

*Primary Examiner*—Nathan W Ha
(74) *Attorney, Agent, or Firm*—Mikio Ishimaru

(57) ABSTRACT

A semiconductor package is provided. A leadframe including a die attach paddle, a number of inner leads, and a number of outer leads, and a number of extended lead tips on the number of outer leads. The inner edges of the number of extended lead tips are in substantial alignment with the inner edges of the number of inner leads. A die is attached to the die attach paddle. A number of bonding wires is used to connect the die to the number of inner leads and the extended lead tips on the number of outer leads, and an encapsulant is formed over the leadframe and the die.

10 Claims, 4 Drawing Sheets

Figure # DUAL ROW LEADFRAME AND FABRICATION METHOD

CROSS-REFERENCE TO RELATED APPLICATION(S)

This is a Divisional of application Ser. No. 10/846,171 filed May 13, 2004, now U.S. Pat No. 7,060,536 which is hereby incorporated by reference herein.

TECHNICAL FIELD

The present invention relates generally to semiconductor packages, and more particularly to a method and apparatus for a semiconductor package having a dual row leadframe.

BACKGROUND ART

In the electronics industry, the tendency has been to reduce the size of electronic devices such as camcorders and portable telephones while increasing performance and speed. Integrated circuit packages for complex systems typically are comprised of a multiplicity of interconnected integrated circuit chips. The integrated circuit chips usually are made from a semiconductor material such as silicon or gallium arsenide. Semiconductor devices are formed in the various layers of the integrated circuit chips using photolithographic techniques. The integrated circuit chips may be mounted in packages that are then mounted on printed wiring boards.

Packages including integrated circuit chips typically have numerous external pins that are mechanically attached by solder or a variety of other known techniques to conductor patterns on the printed wiring board.

Typically, the packages on which these integrated semiconductor chips are mounted include a substrate or other chip mounting device. One example of such a substrate is a leadframe. High performance leadframes typically are multi-layer structures including power, ground, and signal planes.

Leadframes also typically include at least an area on which an integrated circuit chip is mounted and a plurality of power, ground, and/or signal leads to which power, ground, and/or signal sites of the integrated semiconductor chip are electronically attached. Semiconductor integrated chips may be attached to the leadframe using adhesive or any other techniques for attaching such chips to a leadframe which are commonly known to those skilled in the art, such as soldering. The power, ground and signal sites on the chip may then be electrically connected to selected power, ground and signal plane or individual leads of the leadframe.

Leadframes have been used extensively in the integrated circuit packaging industry mainly because of their low manufacturing cost and high reliability. Leadframe packages remain a cost-effective solution for packaging integrated circuits despite the introduction of various leadless packages in recent years.

Typical leadframe packages include a die attach paddle, or pad, surrounded by a number of leads. The leads are temporarily attached to the die attach paddle. An integrated circuit chip, is attached to the die attach paddle using a conductive adhesive such as silver epoxy. The conductive adhesive is cured after die attach. After the die is attached to the die paddle, a wire-bonding process is used to make electrical interconnections between the integrated circuit and the leads of the leadframe. After wire bonding, the leadframe with the integrated circuit attached is encapsulated using a molding compound.

Such enclosures may include encapsulation in a plastic or a multi-part housing made of plastic ceramic, or metal. The enclosure protects the leadframe and the attached chip from physical, electrical, and/or chemical damage. Finally, post mold curing and singulation steps are conducted to complete the packaging process.

The leadframe and attached chip(s) may then be mounted on, for example, a circuit board, or card along with other leadframes or devices. The circuit board or card may then be incorporated into a wide variety of devices such as computers, automobiles, and appliances, among others.

As integrated circuits have become smaller with increased performance capabilities leadframes for integrated circuits have been adapted to accommodate these integrated circuits. A staggered dual row leadframe has found increased use to provide additional leads on a leadframe of a given size. The dual row leadframe includes an inner row of leads and an outer row of leads surrounding a pad to which the integrated circuit die is attached. The contact pads on the integrated circuit are connected to the inner and the outer rows of leads with bonding wires in accordance with the particular design of the semiconductor package.

One problem that persists with dual row leadframes is that the length of the bonding wires to the inner row of leads is shorter than the length of the bonding wires to the outer row of leads. The length of the bonding wires can effect the electrical performance of the semiconductor package. Connections that are considered critical to the operation of the semiconductor package usually need to be positioned to use the shorter bonding wire length to improve the performance of the semiconductor package thus restricting flexibility in the design of the integrated circuit.

Additionally, dual row leadframes have a tie bar located at the corners of the leadframe to temporarily attach the leads to the die attach paddle. During encapsulation and singulation of the dies, the corner tie bar can be dislocated from the mold creating a path for moisture or other contaminants to contact the integrated circuit thereby causing failures of the semiconductor packages.

Solutions to these problems have been long sought but prior developments have not taught or suggested any solutions and, thus, solutions to these problems have long eluded those skilled in the art.

DISCLOSURE OF THE INVENTION

The present invention provides a semiconductor package including a leadframe having a die attach paddle, a number of inner leads, and a number of outer leads, wherein the outer leads have a number of extended lead tips. The inner edges of the number of extended lead tips are in substantial alignment with the inner edges of the number of inner leads. A die is attached to the die attach paddle. A number of bonding wires is used to connect the die to the number of inner leads and the number of outer leads. An encapsulant is formed over the leadframe and the die to complete the semiconductor package.

The present invention provides a dual row leadframe that increases design flexibility by facilitating the use of bonding wires that are substantially the same length thereby enhancing the electrical performance of the semiconductor package.

Additionally, the present invention provides a leadframe with tie bars fused to one of the leads intermediate the corners of the leadframe to increase the potential number of leads in the leadframe.

Also, the present invention provides a locking mechanism to reduce the chances of delamination during the encapsulation and singulation processes thereby increasing the reliability of semiconductor packages.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
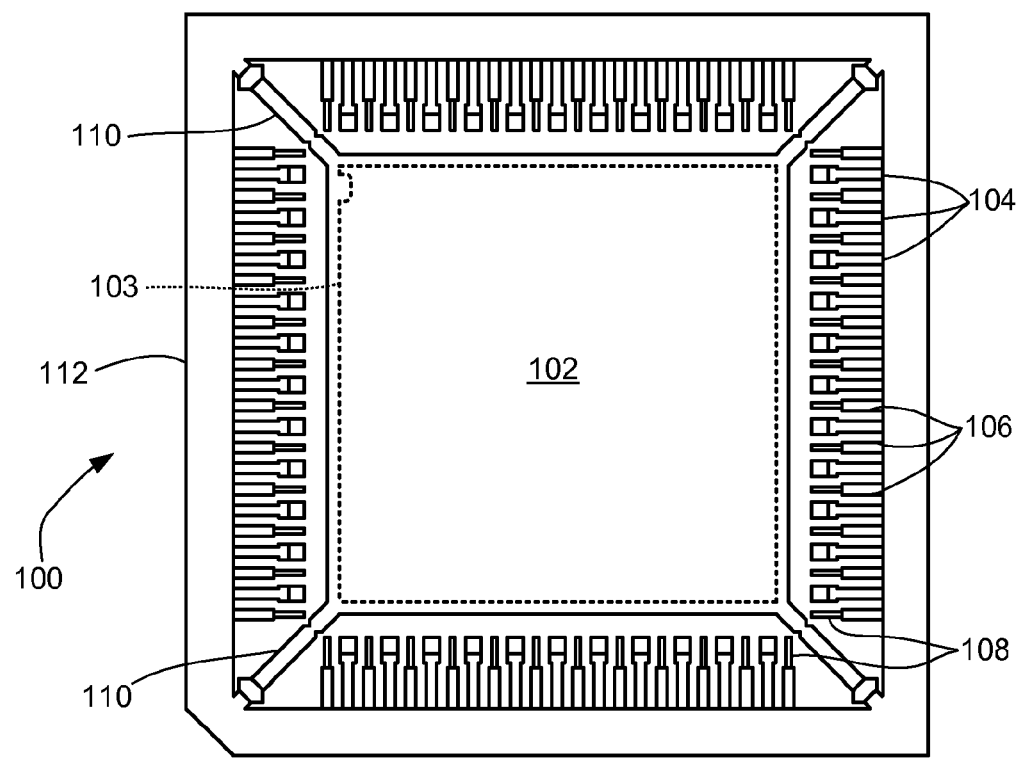
FIG. 1 is a plan view of a leadframe manufactured in accordance with one embodiment of the present invention.

In the following description, numerous specific details are given to provide a thorough understanding of the invention. However, it will be apparent that the invention may be practiced without these specific details. In order to avoid obscuring the present invention, some well-known system configurations and process steps are not disclosed in detail.

Likewise, the drawings showing embodiments of the present invention are semi-diagrammatic and not to scale and, particularly, some of the dimensions are for the clarity of presentation and are shown greatly exaggerated in the FIGS. Generally, the device can be operated in any orientation. Also, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the leadframe, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

The term "processing" as used herein includes deposition of material or photoresist, patterning, exposure, development, etching, cleaning, and/or removal of the material or photoresist as required in forming a described structure.

Referring now to FIG. 1, therein is shown plan view of a leadframe 100 manufactured in accordance with one embodiment of the present invention. The leadframe 100 has a die attach paddle 102 centrally located in the leadframe 100. The die attach paddle 102 has a half-etched portion 103 around the periphery of the die attach paddle 102. The half-etched portion 103 serves as a locking feature for a molding compound (not shown) to reduce the possibility of delamination of the molding compound from the die attach paddle 102.

A number of inner leads 104 is positioned around the periphery of the die attach paddle 102. Interleaved between the number of inner leads 104 is a number of outer leads 106. The number of outer leads 106 has a number of extended lead tips 108 attached thereto. The number of extended lead tips 108 is sized so the innermost edges of the number of extended lead tips 108 are substantially in line with the innermost edge of the number of inner leads 104.

The leadframe 100 also has a number of corner tie bars 110 located at each corner of the leadframe 100. The number of corner tie bars 110 connects the number of inner leads 104, the number of outer leads 106, and the die attach paddle 102. The number of corner tie bars 110 is used to hold the leadframe in place during subsequent molding and singulation operations. An outer leadframe 112 surrounds the number of inner leads 104 and the number of outer leads 106. The outer leadframe 112 is connected to the number of corner tie bars 110.

Figure 2:
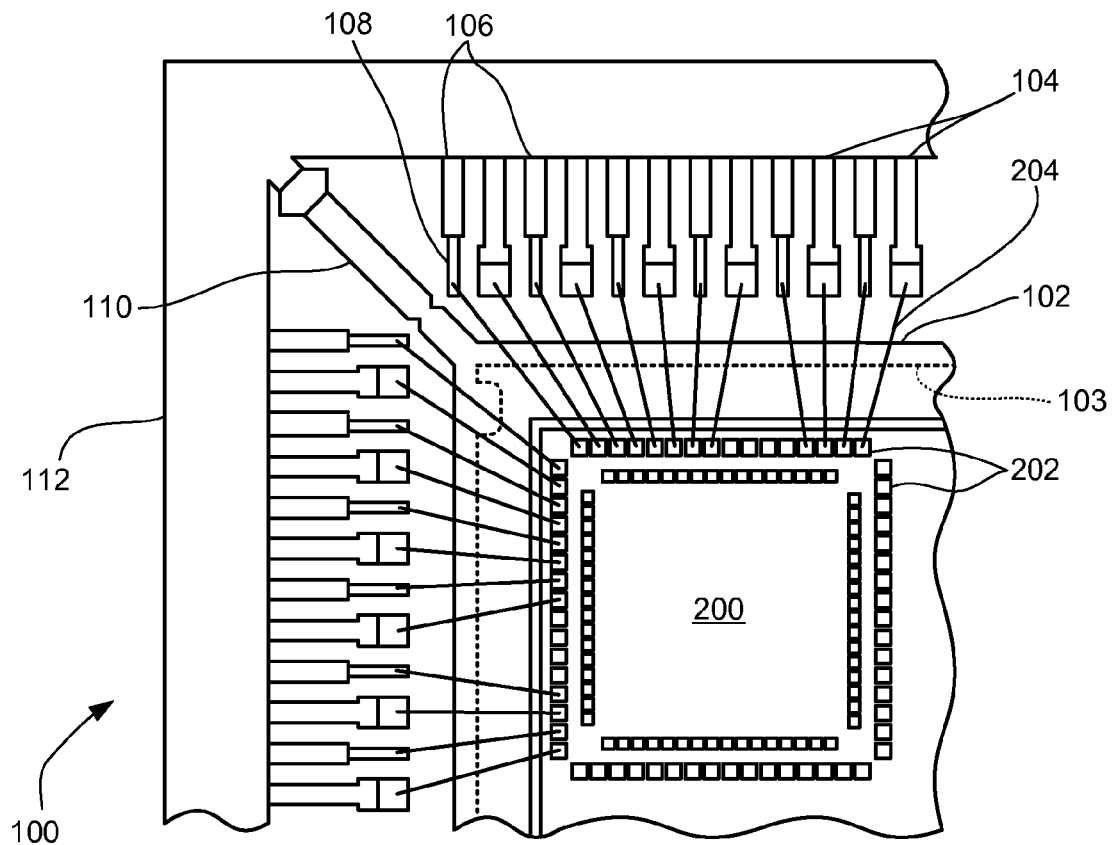
FIG. 2 is an enlarged view of a corner portion of the structure of FIG. 1 after wire bonding an integrated circuit to the leadframe.

Referring now to FIG. 2, therein is shown an enlarged view of a corner portion of the structure of FIG. 1 after wire bonding an integrated circuit, or a die 200, to the leadframe 100. The die 200 has a number of bonding pads 202 around the periphery of the die 200.

The number of bonding pads 202 is electrically connected to the number of inner leads 104 and the number of extended lead tips 108 on the number of outer leads 106 by a number of bonding wires 204. Each of the number of bonding wires 204 is a fine, conductive wire, such as gold (Au), aluminum (Al), or other conductive wire. The number of bonding wires 204 is attached between the number of bonding pads 202 on one hand, and the number of inner leads 104 and the extended lead tips 108 on the number of outer leads 106 on the other hand, using conventional wire bonding processes, such as ultrasonic bonding, compression bonding, soldering or other suitable techniques.

The length of each of the number of bonding wires 204 is substantially equal. Thus, each of the number of bonding wires 204 has a substantially equal parasitic capacitance thereby enhancing the electrical performance of the resultant packaged semiconductor package as compared to a leadframe that does not have the number of extended lead tips 108 on the number of outer leads 106. Additionally, flexibility in assigning locations of critical signals on the die 200 to specific ones of the number of bonding pads 202 is increased due to the substantially equal length of the number of bonding wires 204.

Figure 3:
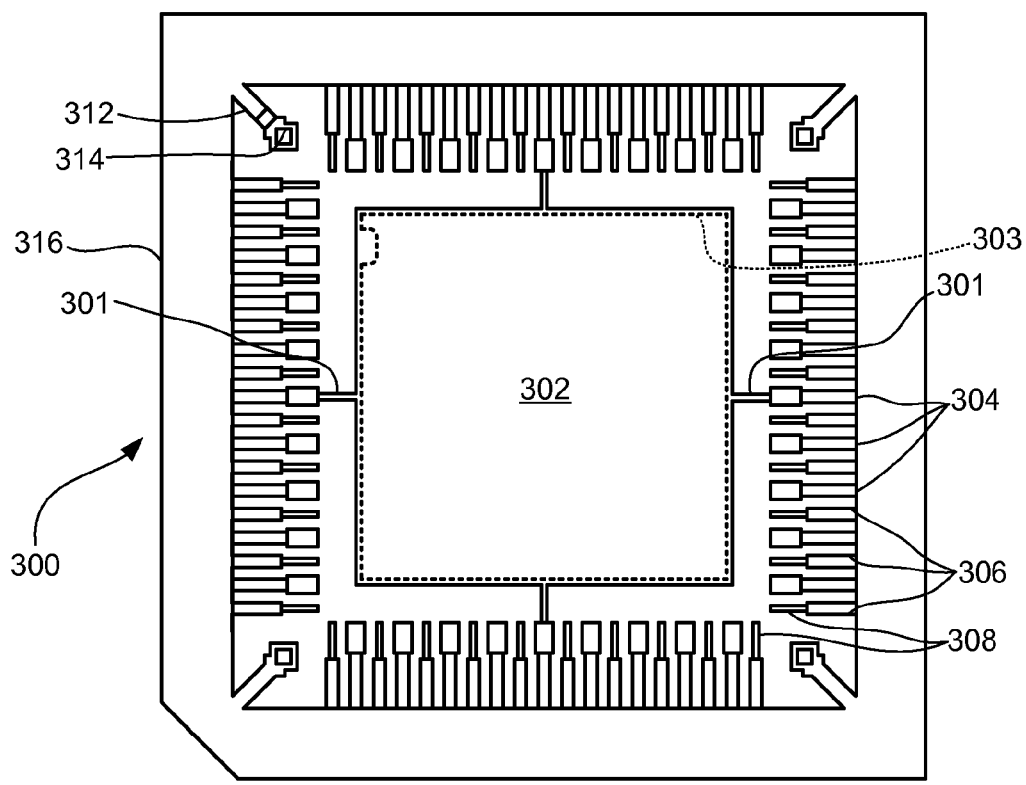
FIG. 3 is a plan view of a leadframe having tie bars fused to some of the leads of the leadframe manufactured in accordance with another embodiment of the present invention.

Referring now to FIG. 3, therein is shown a plan view of another embodiment of a leadframe 300 having a number of tie bars 301 fused to some of the leads of the leadframe 300. The leadframe 300 has a die attach paddle 302 centrally located on the leadframe 300. The die attach paddle 302 has a half-etched portion 303 around the periphery of the die attach paddle 302. The half-etched portion 303 serves as a locking feature for a molding compound (not shown) to reduce the possibility of delamination of the molding compound from the die attach paddle 302.

A number of inner leads 304 is positioned around the periphery of the die attach paddle 302. Interleaved between the number of inner leads 304 is a number of outer leads 306. The number of outer leads 306 has a number of extended lead tips 308 attached thereto. The number of extended lead tips 308 is sized so the innermost edges of the number of extended lead tips 308 are substantially in line with the innermost edge of the number of inner leads 304.

Each of the number of tie bars 301 is located intermediate the corners of the die attach paddle 302. The number of tie bars 301 connects the number of inner leads 304 and the number of outer leads 306 to the die attach paddle 302. Each of the number of tie bars 301 is connected between the die attach paddle 302 and one of the number of inner leads 304.

The elimination of the number of corner tie bars 110 shown in FIG. 1 provides additional space that can be used to add more leads to the leadframe 300. Additionally, the leadframe 300 has a number of corner bars 312 located at each corner of the leadframe 300. Each of the number of corner bars 312 has an anchor hole 314. The anchor hole 314 is used to provide a locking mechanism to hold the leadframe 300 in place during subsequent molding and singulation operations. It has been discovered that the leadframe 300 using the number of corner bars 312 having the anchor hole 314 reduces the chances of delamination of an encapsulant from the leadframe 300 during subsequent molding and singulation operations.

The leadframe 300 also has an outer leadframe 316 surrounding the number of inner leads 304 and the number of outer leads 306. The outer leadframe 316 is connected to the corner bars 312.

Figure 4:
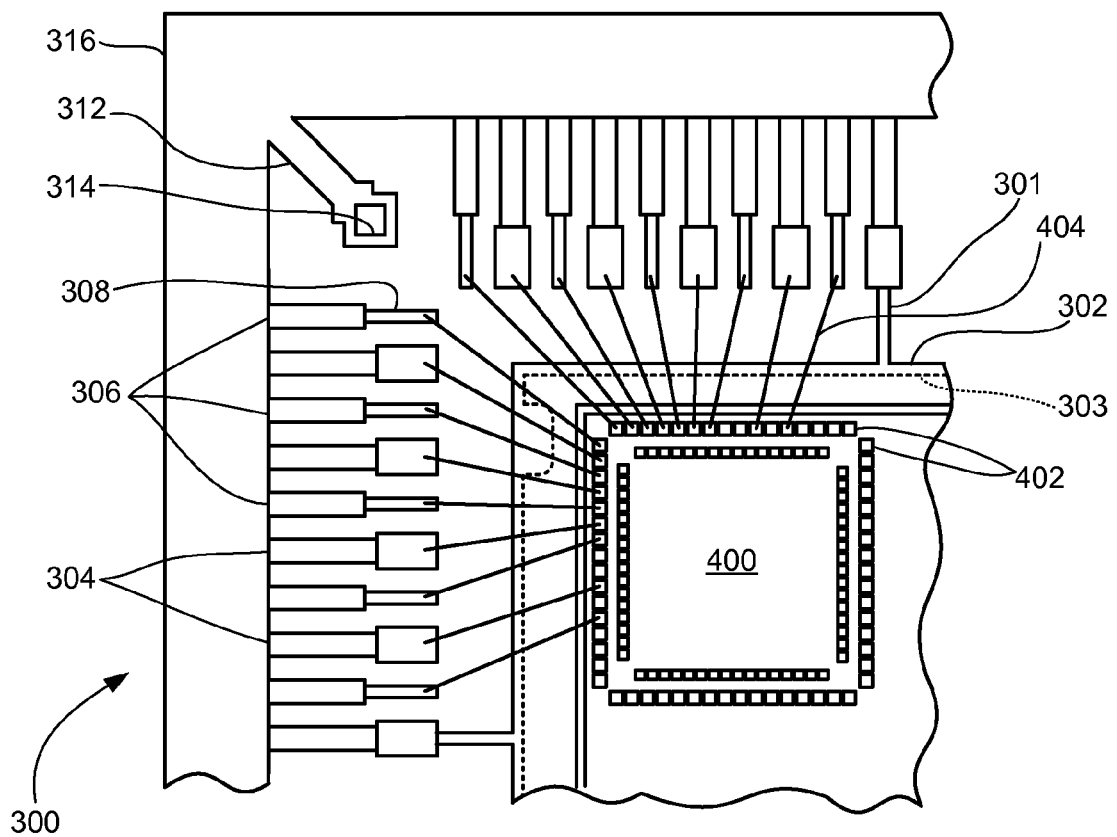
FIG. 4 is an enlarged view of a corner portion of the structure of FIG. 3 after wire bonding an integrated circuit to the leadframe.

Referring now to FIG. 4, therein is shown enlarged view of a corner portion of the structure of FIG. 3 after wire bonding a die 400 to the leadframe 300. The die 400 has a number of bonding pads 402 around the periphery of the die 400.

The number of bonding pads 402 is electrically connected to the number of inner leads 304 and the number of extended lead tips 308 on the number of outer leads 306 by a number of bonding wires 404. The number of bonding wires 404 is a plurality of fine, conductive wires, such as gold (Au), aluminum (Al), or other conductive wires. The number of wires is attached between the number of bonding pads 402 on one hand, and the number of inner leads 304 and the extended lead tips 308 on the number of outer leads 306 on the other hand, using conventional wire bonding processes, such as ultrasonic bonding, compression bonding, soldering, or other suitable techniques.

The length of each of the number of bonding wires 404 is substantially equal. Thus, each of the number of bonding wires 404 has a substantially equal parasitic capacitance thereby enhancing the electrical performance of the resultant semiconductor package as compared to a leadframe that does not have the number of extended lead tips 308 on the number of outer leads 306. Additionally, flexibility in assigning locations of critical signals on the die 400 to specific ones of the number of bonding pads 402 is increased due to the substantially equal length of the number of bonding wires 404, because there is less need to be concerned with the varying parasitic capacitance associated with bonding wires of different lengths.

Figure 5:
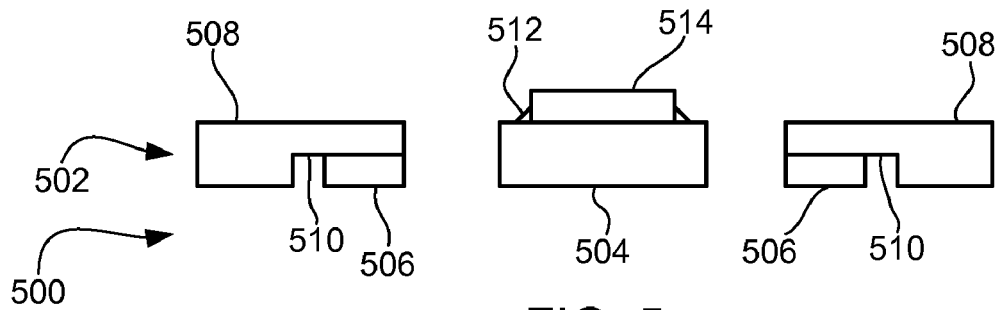
FIG. 5 is a cross sectional view of a semiconductor package at an intermediate stage of manufacture.

Referring now to FIG. 5, therein is shown a cross sectional view of a semiconductor package 500 at an intermediate stage of manufacture in accordance with an embodiment of the present invention. The semiconductor package 500 includes a leadframe 502 representative of the leadframe 100 shown in FIG. 1, or the leadframe 300 shown in FIG. 3. The leadframe 502 includes a die attach paddle 504, a number of inner leads 506, and a number of outer leads 508. The number of outer leads has a number of extended lead tips 510. An adhesive layer 512 has been applied to the die attach paddle 504 in a conventional manner such as by applying an adhesive tape or dispensing an adhesive liquid or paste that is subsequently cured. The adhesive layer 512 can be either electrically conductive or non-conductive as required in a particular application. A die 514 is attached to the die attach paddle 504 using the adhesive layer 512.

Figure 6:
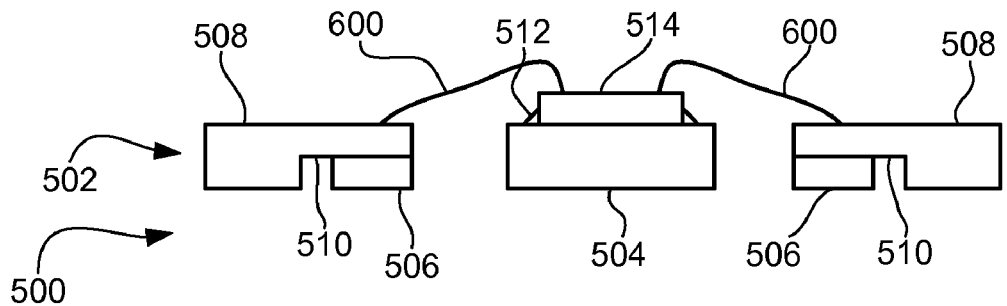
FIG. 6 is the structure of FIG. 5 after wire bonding an integrated circuit to a die attach paddle of a leadframe.

Referring now to FIG. 6, therein is shown the structure of FIG. 5 after wire bonding a die 514 to the die attach paddle 504 of the leadframe 502. The die 514 is wire bonded to the number of extended lead tips 510 of the number of outer leads 508 using a number of bonding wires 600 in a conventional manner selected from at least one of ultrasonic bonding, thermosonic bonding, soldering, and combinations thereof using wire bonding equipment readily available in the semiconductor industry.

Figure 7:
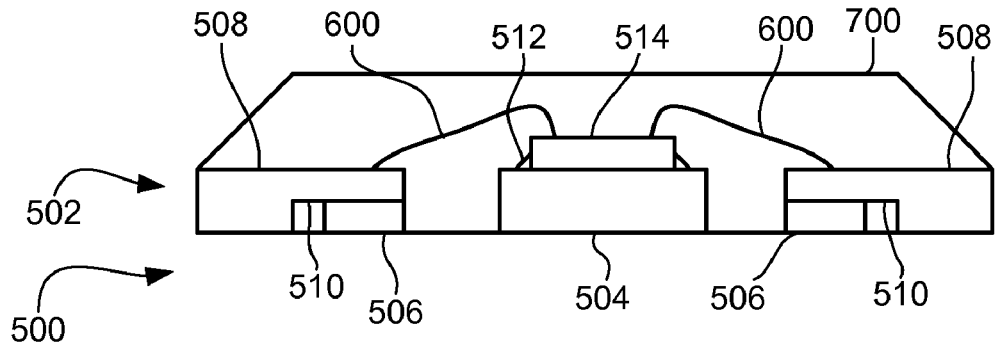
FIG. 7 is the structure of FIG. 6 after encapsulation with a molding compound.

Referring now to FIG. 7, therein is shown the structure of FIG. 6 after encapsulation of the semiconductor package 500. The structure of FIG. 6 is encapsulated in an encapsulant 700, such as an epoxy mold compound or other suitable material, using conventional molding equipment to form the semiconductor package 500. The semiconductor package 500 can be used for subsequent connection to a printed circuit board (not shown) in a conventional manner.

Figure 8:
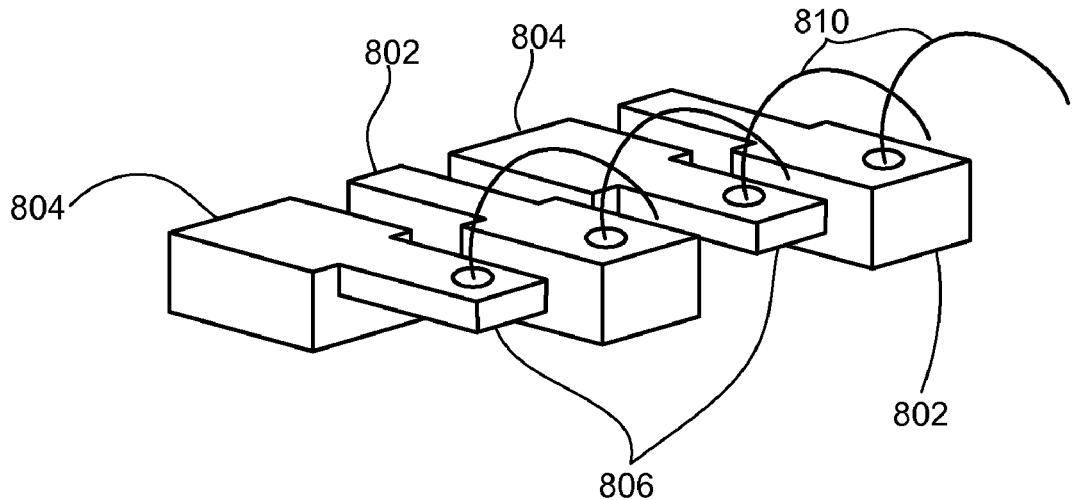
FIG. 8 is an enlarged view of the leads shown in FIGS. 5-7.

Referring now to FIG. 8, therein is shown an enlarged perspective view of a number of inner leads 802 and a number of outer leads 804. The number of inner leads 802 is representative of the number of inner leads 104 Shown in FIGS. 1 and 2, or the number of inner leads 304 shown in FIGS. 3 and 4. Similarly, the number of outer leads 804 is representative of the number of outer leads 106 shown in FIGS. 1 and 2, or the number of outer leads 306 shown in FIGS. 3 and 4.

The number of outer leads 804 has a number of extended lead tips 806, which is representative of the number of extended lead tips 108 shown in FIGS. 1 and 2, or the number of extended lead tips 308 shown in FIGS. 3 and 4. The number of extended lead tips 806 extends inwardly from the number of outer leads 804 to the inner edge of the number of inner leads 802. A number of bonding wires 810 is wire bonded between the number of inner leads 802 and a die (not shown), such as the die 200 shown in FIG. 2, or the die 400 shown in FIG. 4.

Figure 9:
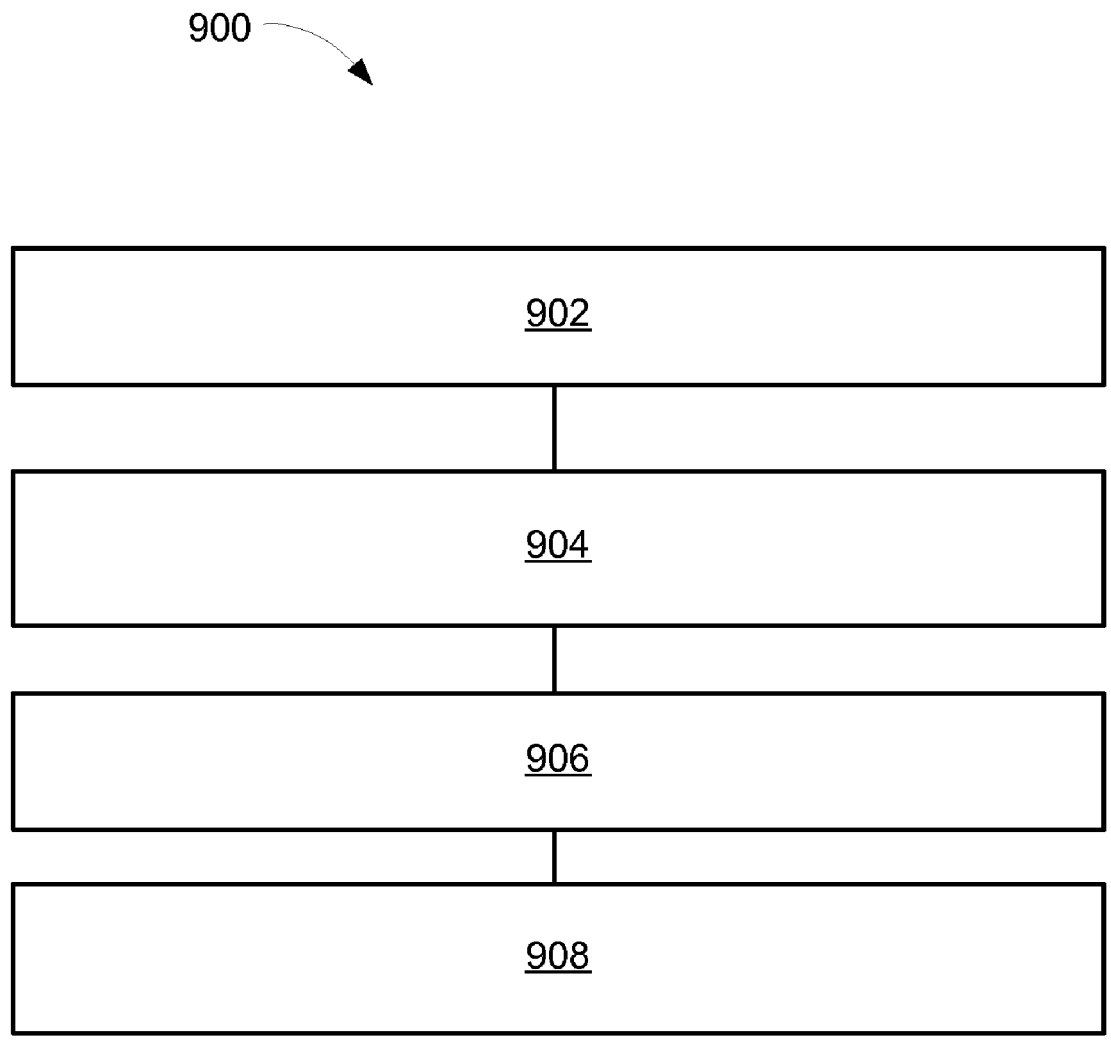
FIG. 9 is a flow chart of a method for manufacturing a semiconductor package in accordance with an embodiment of the present invention.

Referring now to FIG. 9, therein is shown a flow chart of a method 900 for manufacturing a semiconductor package comprising: providing a leadframe comprising: a die attach paddle; a number of inner leads; a number of outer leads; a number of extended lead tips on the number of outer leads to extend the inner edges of the number of outer leads in substantial alignment with the inner edges of the number of inner leads, in a block 902; attaching a die to the die attach paddle, in a block 904; wire bonding the die to the number of inner leads and the number of outer leads in a block 906; and encapsulating the leadframe and the die attach paddle, in a block 908.

Thus, it has been discovered that the method and apparatus of the present invention furnish important and heretofore unavailable solutions, capabilities, and functional advantages for manufacturing a semiconductor package using a leadframe. The resulting process and configurations are straightforward, economical, uncomplicated, highly versatile, and effective, use conventional technologies, and are thus readily suited for manufacturing semiconductor packages that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters heretofore set forth herein or shown in the accompanying drawings are to be interpreted in an illustrative and non-limiting sense.

The invention claimed is:

1. A semiconductor package comprising:
   a leadframe comprising:
      a die attach paddle;
      a number of inner leads;
      a number of outer leads;
      a number of extended lead tips on the number of outer leads to extend the inner edges of the number of outer leads in substantial alignment with the inner edges of the number of inner leads;
   a die attached to the die attach paddle
   a number of bonding wires connecting the die to the number of inner leads and the number of outer leads; and
   an encapsulant over the leadframe and the die.

2. The semiconductor package as claimed in claim 1, wherein:
   the leadframe comprises a number of tie bars connecting the die attach paddle to a number of corners of the leadframe.

3. The semiconductor package as claimed in claim 1, wherein:
   the leadframe comprises a number of tie bars connecting the die attach paddle to at least some of the number of inner leads.

4. The semiconductor package as claimed in claim 1, wherein:
   the leadframe comprises an anchor hole for locking the leadframe in position in a mold.

5. The semiconductor package as claimed in claim 1, wherein:
   the leadframe provides:
      the number of inner leads; and
      the number of outer leads having the number of extended lead tips, wherein:
   the number of inner leads and the number of extended lead tips are substantially the same distance from the die attach paddle.

6. A leadframe comprising:
   a die attach paddle;
   a number of inner leads around the periphery of the die attach paddle;
   a number of outer leads around the die attach paddle;
   a number of extended lead tips to the outer leads, wherein:
      the extended lead tips extend inwardly toward the die attach paddle;
   whereby the inner edges of the number of inner leads and the inner edges of the number of extended lead tips are substantially in alignment.

7. The leadframe as claimed in claim 6, further comprising:
   a number of tie bars connecting the die attach paddle to a number of corners of the leadframe.

8. The leadframe as claimed in claim 6, further comprising:
   a number of tie bars connecting the die attach paddle to at least some of the number of inner leads.

9. The leadframe as claimed in claim 6, further comprising:
   an anchor hole for locking the leadframe in a mold.

10. The leadframe as claimed in claim 6, wherein:
    the number of outer leads is interleaved with the number of inner leads.

* * * * *

UNITED STATES PATENT AND TRADEMARK OFFICE
CERTIFICATE OF CORRECTION

| | | |
|---|---|---|
| PATENT NO. | : 7,339,258 B2 | Page 1 of 1 |
| APPLICATION NO. | : 11/379740 | |
| DATED | : March 4, 2008 | |
| INVENTOR(S) | : Jeffrey D. Punzalan et al. | |

It is certified that error appears in the above-identified patent and that said Letters Patent is hereby corrected as shown below:

Column 7, claim 1, line 24, delete "paddle" and insert therefor --paddle;--

Signed and Sealed this

Tenth Day of June, 2008

JON W. DUDAS
*Director of the United States Patent and Trademark Office*